US011521932B2

(12) United States Patent
Cheah et al.

(10) Patent No.: US 11,521,932 B2
(45) Date of Patent: Dec. 6, 2022

(54) COMPOSITE BRIDGE DIE-TO-DIE INTERCONNECTS FOR INTEGRATED-CIRCUIT PACKAGES

(71) Applicant: Intel Corporation, Santa Clara, CA (US)

(72) Inventors: Bok Eng Cheah, Bukit Gambir (MY); Jackson Chung Peng Kong, Tanjung Tokong (MY); Jenny Shio Yin Ong, Bayan Lepas (MY); Ping Ping Ooi, Butterworth (MY); Seok Ling Lim, Kulim (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/025,990

(22) Filed: Sep. 18, 2020

(65) Prior Publication Data

US 2021/0183776 A1    Jun. 17, 2021

(30) Foreign Application Priority Data

Dec. 11, 2019   (MY) .............................. PI2019007401

(51) Int. Cl.
| H01L 23/538 | (2006.01) |
| H01L 21/56 | (2006.01) |
| H01L 23/31 | (2006.01) |
| H01L 23/00 | (2006.01) |
| H01L 25/065 | (2006.01) |
| H01L 25/00 | (2006.01) |

(52) U.S. Cl.
CPC ........ *H01L 23/5384* (2013.01); *H01L 21/565* (2013.01); *H01L 23/3185* (2013.01); *H01L 24/11* (2013.01); *H01L 24/16* (2013.01); *H01L 25/0652* (2013.01); *H01L 25/0655* (2013.01); *H01L 25/50* (2013.01)

(58) Field of Classification Search
None
See application file for complete search history.

(56) References Cited

U.S. PATENT DOCUMENTS

2017/0077022 A1 * 3/2017 Scanlan ................ H01L 21/568

FOREIGN PATENT DOCUMENTS

| CN | 112951817 | 6/2021 |
| EP | 3363048 | 8/2018 |
| JP | 2021093516 | 6/2021 |
| KR | 20170111677 | 10/2017 |
| TW | 202123411 | 6/2021 |
| WO | 2019161641 | 8/2019 |

OTHER PUBLICATIONS

"European Application Serial No. 20197863.2, Extended European Search Report dated Mar. 3, 2021", 13 pgs.
"European Application Serial No. 20197863.2, Response filed Dec. 16, 2021 to Extended European Search Report dated Mar. 3, 2021", 16 pgs.

* cited by examiner

*Primary Examiner* — Long Pham
(74) *Attorney, Agent, or Firm* — Schwegman Lundberg & Woessner, P.A.

(57) ABSTRACT

Disclosed embodiments include composite-bridge die-to-die interconnects that are on a die side of an integrated-circuit package substrate and that contacts two IC dice and a passive device that is in a molding material, where the molding material also contacts the two IC dice.

21 Claims, 8 Drawing Sheets

US 11,521,932 B2

COMPOSITE BRIDGE DIE-TO-DIE INTERCONNECTS FOR INTEGRATED-CIRCUIT PACKAGES

PRIORITY APPLICATION

This application claims the benefit of priority to Malaysian Application Serial Number PI2019007401, filed Dec. 11, 2019, which is incorporated herein by reference in its entirety.

FIELD

This disclosure relates to power delivery for integrated-circuit device packages.

BACKGROUND

Integration of multiple integrated-circuit chips within a package, for example multi-chip package (MCP) integrated-circuit devices with high interconnect density between chips has power-delivery issues such as undesired inductance loops and impedance peak profiles.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Disclosed embodiments include composite bridge die-to-die interconnects that are assembled to the die sides of integrated circuit (IC) package substrates, where passive devices are located in the molding layer between die-side mounted integrated-circuit (IC) dice. Power-delivery networks (PDNs) are facilitated where passive devices such as decoupling capacitors are located in the molding layer with IC dice and that are assembled to the composite bridge die-to-die interconnects. Such passive-device interconnects, facilitate decoupling power-delivery issues that are faster by the proximate location of the passive devices. In an embodiment, the capacitor is a multi-layer ceramic capacitor. In an embodiment, the capacitor is a silicon capacitor.

Ball-grid array densities are facilitated for input-output (I/O) density changes where keep-out-zone issues are addressed. Location of the passive devices, closer to the integrated-circuit dice, relieves integrated-circuit package substrate real estate issues to increase interconnect densities.

Power integrity of electrical performance is achieved by reduced package inductance looping. Decoupling capacitors are directly coupled to power (Vcc) rails and to ground reference voltage (Vss), which lowers power delivery network impedance ($Z_{PDN}$) and jitter behaviors.

Figure 1A:
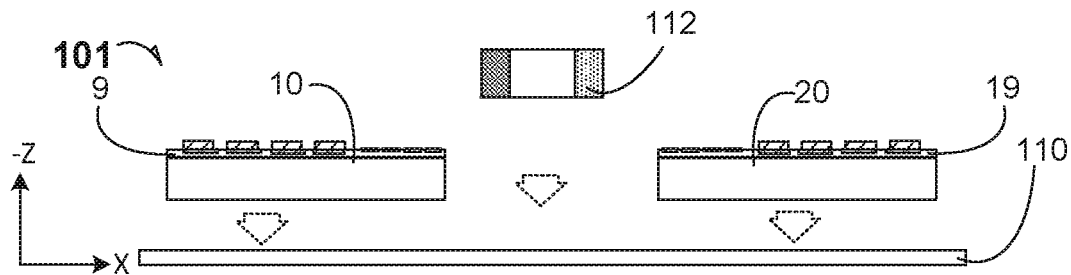
FIG. 1A is a cross-section elevation 101 during assembly of a composite bridge die-to-die interconnects that become part of an integrated-circuit package according to several embodiments.

FIG. 1A is a cross-section elevation 101 during assembly of a composite bridge die-to-die interconnect that becomes part of an integrated-circuit package according to several embodiments. The vertical orientation is inverted, compared to the application of composite bridge die-to-die interconnects as are further disclosed. (See, e.g. FIG. 1).

A first integrated-circuit (IC) die 10 and a subsequent IC die 20 are being seated on a carrier 110, along with a passive device 112 according to an embodiment. The first IC die 10 includes an active layer and metallization 9, that includes transistors and other active devices fabricated in semiconductive material. Similarly, the subsequent IC die 20 includes an active layer and metallization 19.

Figure 1B:
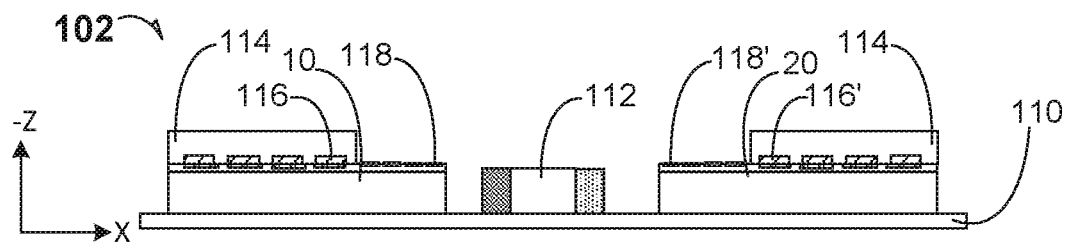
FIG. 1B is a cross-section elevation of the assembly depicted in FIG. 1A after further assembly according to an embodiment.

FIG. 1B is a cross-section elevation 102 of the assembly 101 depicted in FIG. 1A after further assembly according to an embodiment. A mask 114, such as a dry-film resist (DFR) 114 has been patterned over portions of the first and subsequent IC dice 10 and 20, and the DFR covers larger, package-connect bond pads 116 and 116' and leaves exposed, composite-bridge bond pads 118 and 118', respectively, for further connection to the composite-bridge die-to-die interconnect 132 (see FIG. 1H).

Figure 1C:
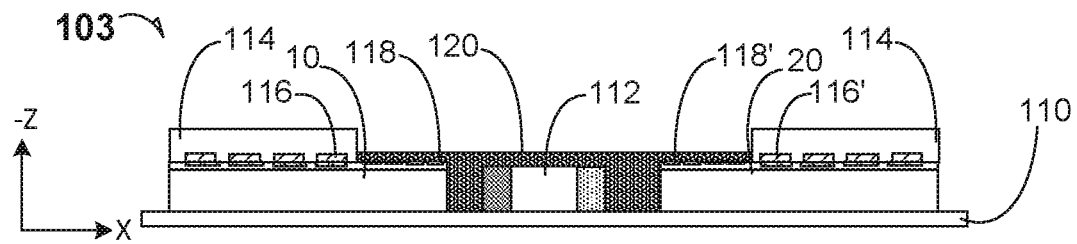
FIG. 1C is a cross-section elevation of the assembly depicted in FIG. 1B after further processing according to an embodiment.

FIG. 1C is a cross-section elevation 103 of the assembly 102 depicted in FIG. 1B after further processing according to an embodiment. A molding layer 120 is filled into spaces between the first and subsequent IC dice 10 and 20, such that the passive device 112 is located in the molding layer between the first and subsequent IC dice 10 and 20. The molding layer 120 also covers the composite-bridge bond pads 118 and 118' in preparation for opening contact corridors and forming interconnect vias. The composite-bridge bond pads 118 and 118', make a tighter bump-pitch geometry that is facilitated by the composite-bridge die-to-die interconnect embodiments.

Figure 1D:
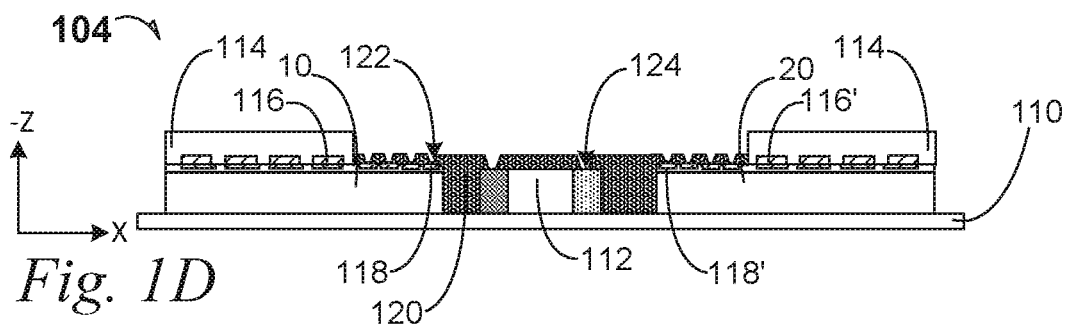
FIG. 1D is a cross-section elevation of the assembly depicted in FIG. 1C after further processing according to an embodiment.

FIG. 1D is a cross-section elevation 104 of the assembly 103 depicted in FIG. 1C after further processing according to an embodiment. Patterning of the molding layer 120 has been accomplished, to open contact corridors 122 to the composite-bridge bond pads 118 and 118'. Patterning of the molding layer 120 has also been accomplished, in the case of a capacitor passive device 120, such as a decoupling capacitor 120, to open contact corridors 124 to respective anode and cathode contacts. In an embodiment, a laser-drilling technique is done to open the contact corridors 122 and 124. In an embodiment, a photolithographic technique is done to open the contact corridors 122 and 124, such as patterning an etching through a mask. In an embodiment, laser drilling is used as well as photolithographic processing.

Figure 1E:
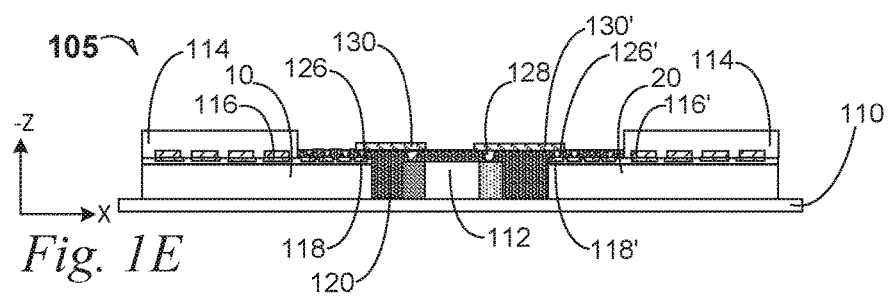
FIG. 1E is a cross-section elevation of the assembly depicted in FIG. 1D after further processing according to an embodiment.

FIG. 1E is a cross-section elevation 105 of the assembly 104 depicted in FIG. 1D after further processing according to an embodiment. Composite-bridge contacts 126 and 126', fill the contact corridors 122 (see FIG. 1D) such as by an electroplating technique, followed by a directional etch to remove material from the upper surfaces of the molding layer 120. Similarly, passive-device contacts 128 are simultaneously filled into contact corridors 124 to contact the electrodes of the passive device 112.

In an embodiment, lateral interconnects 130 and 130' (first 130 and subsequent 130') couple the passive device 112 to composite-bridge contacts 126 and 126'. Patterning of the molding layer 120 has been accomplished, to open contact corridors 122 to the composite-bridge bond pads 118 and 118'. Patterning of the molding layer 120 has also been accomplished, in the case of a capacitor passive device 112, to couple the passive device 112 to composite-bridge bond pads 118 and 118'. In an embodiment, the traces 130 and 130' are simultaneously formed with the contacts 126 and 128, by plating the contacts and the traces, followed by masking a directional etch at the upper surface of the molding material 120, followed by removing the mask to reveal the traces 130 and 130'.

Figure 1F:
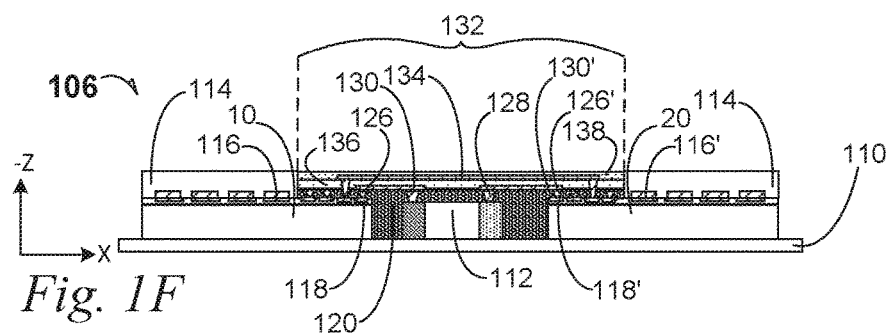
FIG. 1F is a cross-section elevation of a composite-bridge die-to-die interconnect in an integrated-circuit apparatus after further processing of structures depicted in FIG. 1E according to an embodiment.

FIG. 1F is a cross-section elevation of a composite-bridge die-to-die interconnect 132 in an integrated-circuit apparatus 106 after further processing of structures depicted in FIG. 1E according to an embodiment. The composite-bridge die-to-die interconnect 132 incudes the contacts 126 and 126', the passive-device contacts 128 and the lateral interconnects 130 and 130', along with conductive traces 134 (die-to-die trace 134) that bypass the passive device 112. These structures couple the passive device 112 to the composite-bridge die-to-die interconnect 132, and there are interlayer dielectrics 136 and 138 by way of non-limiting example, that support e.g. the conductive trace 134.

Figure 1G:
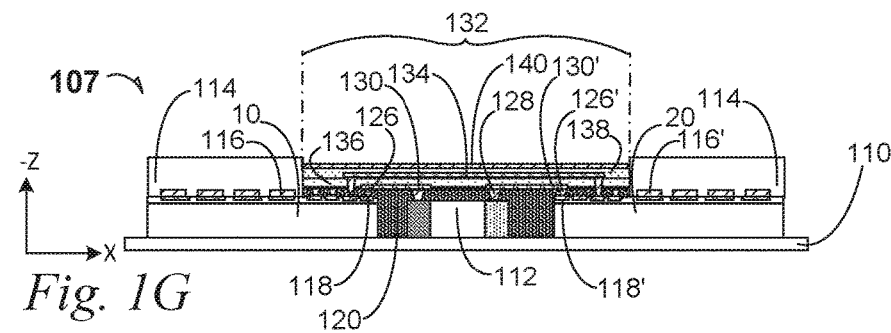
FIG. 1G is a cross-section elevation of the composite-bridge die-to-die interconnect in the integrated-circuit apparatus depicted in FIG. 1F after further processing of structures according to an embodiment.

FIG. 1G is a cross-section elevation of the composite-bridge die-to-die interconnect 132 in the integrated-circuit apparatus 106 depicted in FIG. 1F after further processing of structures according to an embodiment. The IC apparatus 107 has further structure assembled to the composite-bridge die-to-die interconnect 132. These include interlayer dielectric layers (ILDs) such as first ILD 136 and a subsequent ILD 138. Further structures include a conductive shield 140 that will seat upon a die side of an integrated-circuit package substrate. As illustrated, the conductive shield 140 projects a footprint onto the composite-bridge bond pads 118 and 118', and onto the passive device 112. The conductive shield 140 provides protection from electromagnetic coupling between the several conductive traces, e.g. 130, 130' and 134 and any conductive traces and vias that are close by in an integrated-circuit package substrate (see, e.g. the IC package substrate 142 in FIG. 1H).

Figure 1H:
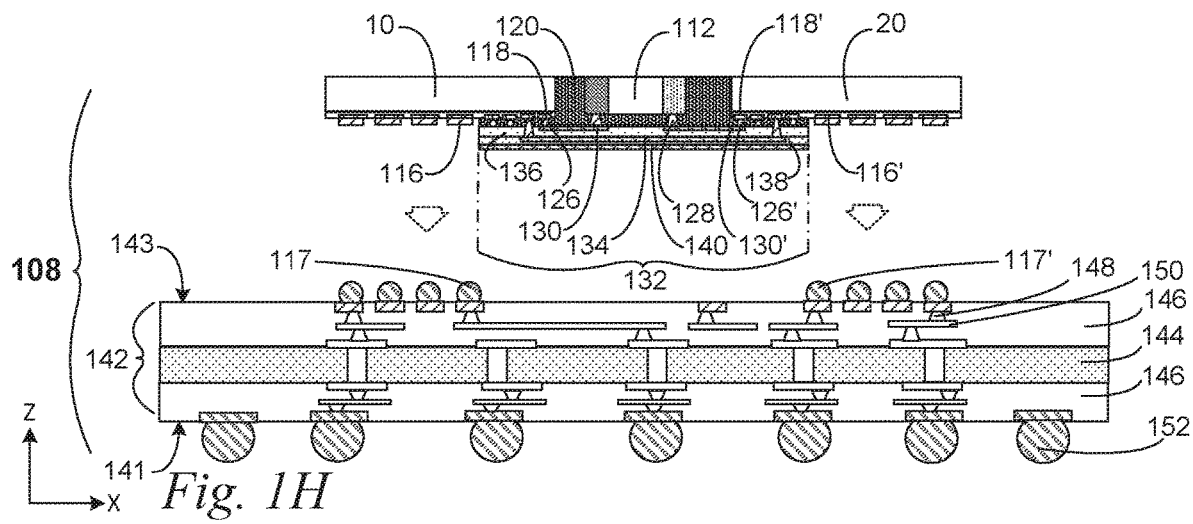
FIG. 1H is a cross-section elevation of the composite-bridge die-to-die interconnect 132 as part of the integrated-circuit apparatus depicted in FIG. 1G after further processing of structures according to an embodiment.

FIG. 1H is a cross-section elevation of the composite-bridge die-to-die interconnect 132 as part of the integrated-circuit apparatus 107 depicted in FIG. 1G after further processing of structures according to an embodiment.

An integrated-circuit package 108 includes the IC dice 10 and 20, the composite-bridge die-to-die interconnect 132 that couples the IC dice 10 and 20, and the assembly has been inverted and is being seated onto an IC package substrate 142 on a die side 143 according to an embodiment. The composite-bridge die-to-die interconnect 132, exposes package-connect bond pads 116 and 116' on each of the first and subsequent IC dice 10 and 20, and the composite-bridge die-to-die interconnect 132, contacts the composite-bridge bond pads 118 and 118'.

The larger bond pads 116 and 116' are being fiducial-connected to die-side electrical bumps 117 and 117' respectively, that may either begin on the IC package die side 143, or may be pre-attached to the respective larger bond pads 116 and 116' after removal of the carrier 110 (see FIG. 1G), and after inversion of the IC dice 10 and 20 and the composite-bridge die-to-die interconnect 132. In any event, standoff created by the die-side electrical bumps 117 and 117', after reflow upon the die side 143, accommodates the standoff of the composite-bridge die-to-die interconnect 132.

In an embodiment, the IC package substrate 142 includes a core layer 144 for rigidity. Above and below the core layer 144, build-up layers 146 include organic layers that accommodate interconnects such as package vias 148 and traces 150 to facilitate interconnection of integrated-circuit (IC) dice 10 and 20 with composite-bridge die-to-die interconnect 132, as well as pin-out connections on the land side 141 of the IC package substrate 142, to an electrical bump array 152. In an embodiment, the organic layers 146 are fabricated from composites of epoxy polymer resins and silica particulate materials. In an embodiment width of the traces 150 is in a range from 5 µm to 40 µm. In an embodiment, the IC package substrate 142 may exclude the core layer 144 for package z-height (or thickness) reduction. In any event, the composite-bridge die-to-die interconnect 132, obviates the need for a silicon-bridge interposer, which would require added Z-height. Further, the composite-bridge die-to-die interconnect 132 also obviates the need for a silicon-bridge such as an embedded multi-die interconnect bridge (EMIB), which would take up useful under-die real estate, under the IC dice 10 and 20.

Figure 1I:
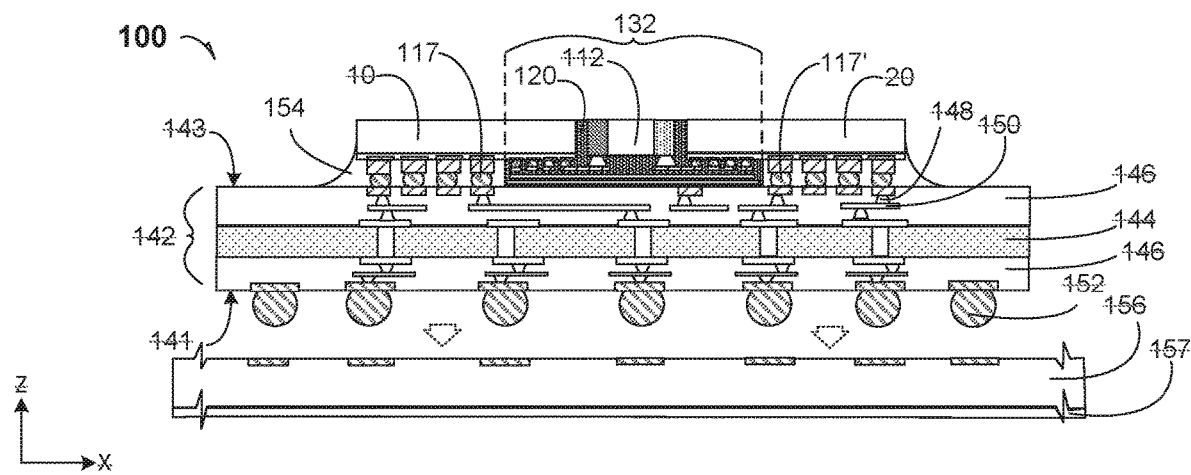
FIG. 1I is a cross-section elevation of an integrated-circuit package apparatus such as the IC package that includes the composite-bridge die-to-die interconnect depicted in FIG. 1H according to several embodiments.

FIG. 1I is a cross-section elevation of an integrated-circuit package apparatus 100 such as the IC package that includes the composite-bridge die-to-die interconnect 132 depicted in FIG. 1H according to several embodiments. The apparatus 100 that includes the first and subsequent IC dice 10 and 20, the composite-bridge die-to-die interconnect 132 and the passive device 112, is seated on the die side 143 of the IC package substrate 142. An underfill mass 154 has been flowed onto the die side 143 under the IC dice 10 and 20 and also to contact the composite-bridge die-to-die interconnect 132.

Where the passive device 112 is a decoupling capacitor 112, improved power integrity is enabled by shortened loop inductance between the capacitor 112 and the IC die that it is servicing, which facilitates uninterrupted current flow that is useful to direct-current (DC) load-line performance and consequently the computing performance of the IC die and any computing system of which it is a part.

Where the passive device 112 is a decoupling capacitor 112, it is coupled to power (Vcc) and to ground (Vss) portion of the several conductive traces within the composite-bridge die-to-die interconnect 132. Other conductive traces and vias within the composite-bridge die-to-die interconnect 132 are used as signal connections, such as data-transmission connections.

As illustrated in an embodiment, the IC package substrate 142 that carries the IC dice 10 and 20 and the composite-bridge die-to-die interconnect 132, is being brought toward a board 156 such as a motherboard 156 or a printed wiring board 156. Electrical contact is made by an electrical bump array, one bump of which is indicated by reference number 152. In an embodiment, the board 156 has an external shell 157 that provides at least one of physical and electrical insulative protection for components on the board 156. For example, the external shell 157 is an integral portion of the board 156, that is part of a hand-held computing system such as a communication device. In an embodiment, the external shell 157 is an integral portion of the board 156, that is part of the exterior of a mobile computing platform such as a drone.

Figure 1J:
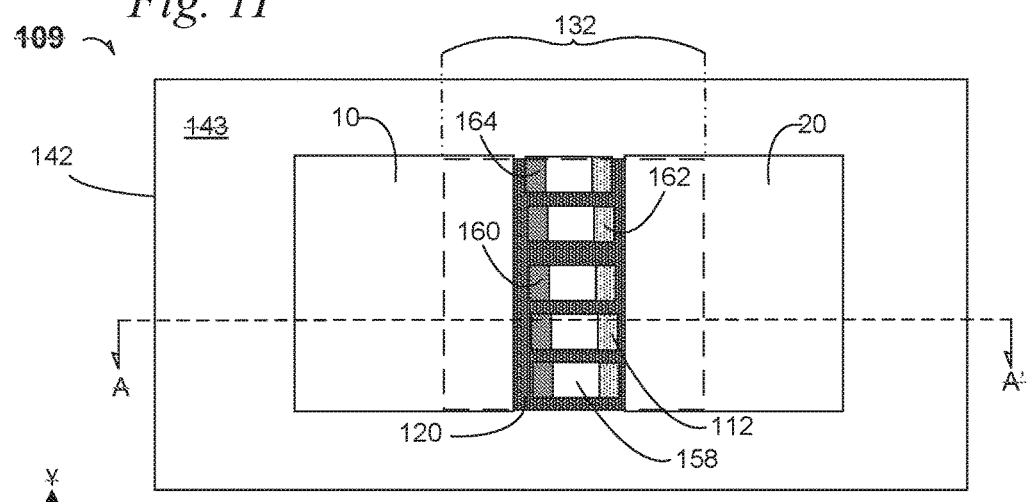
FIG. 1J is a top plan of the composite-bridge die-to-die interconnect-containing integrated-circuit package apparatus depicted in FIG. 1 according to several embodiments.

FIG. 1J is a top plan 109 of the composite-bridge die-to-die interconnect-containing integrated-circuit package apparatus 100 depicted in FIG. 1 according to several embodiments. The cross-section elevation depicted in FIG. 1 may be taken from the section line A-A' in FIG. 1J. The die side 143 supports the first and subsequent IC dice 10 and 20, and the composite-bridge die-to-die interconnect 132 with several passive devices in the molding material between the IC dice 10 and 20.

In an embodiment, the passive device 112 is a first capacitor 112 and a subsequent passive device 158 is a subsequent capacitor 158 that couples into the composite-bridge die-to-die interconnect 132. Further passive devices, where the passive device 112 is a first passive device in the molding material 120, include the subsequent passive device 158, a third passive device 160, a fourth 162 and a fifth passive device 164 according to several embodiments. The several passive devices are in the molding material 120, and they are integral portions of the composite-bridge die-to-die interconnect 132, such that the several passive devices support the IC dice 10 and 20, without the need to be embedded in the IC package substrate 142.

In an embodiment, the passive devices are decoupling capacitors 112, 158, 160, 162 and 164. In an embodiment, subsets of the capacitors are separately coupled to different potential power rails, such as a 1.0 Volt power rail for the first capacitors 112, and 158 and a 1.5 V power rail for the capacitors 160, 162 and 164. In an embodiment, the capacitors have a thickness in a range from 20 μm to 500 μm. In an embodiment, at least one passive device illustrated is a resistor. In an embodiment, at least one passive device illustrate is an inductor.

In an embodiment, a first integrated-circuit die 10 is a central processing unit such as a processor made by Intel Corporation of Santa Clara, Calif. In an embodiment, the subsequent IC die 20 is a graphics processor 20. In an embodiment, the first IC die 10 is bumped onto the die side 143 with a bump array 117 and 117' (see FIG. 1) with a bump-pitch geometry in a range from 70 micrometer (μm) to 150 μm.

Figure 1K:
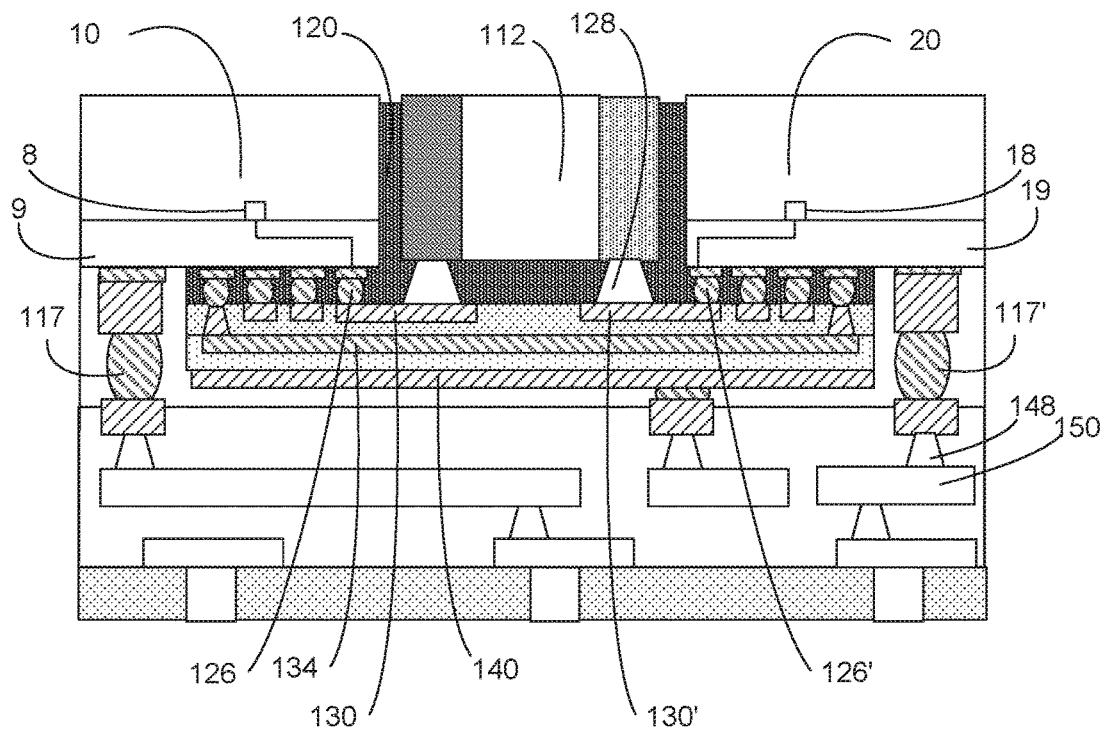
FIG. 1K is a detail section portion of a composite-bridge die-to-die interconnect as it interfaces with an integrated-circuit package and integrated-circuit dice. Item 1L is omitted.

FIG. 1K is a detail section portion of a composite-bridge die-to-die interconnect as it interfaces with an integrated-circuit package and integrated-circuit dice. Item 1L is omitted. The detail section may be taken for example from the integrated-circuit package apparatus 100 depicted in FIG. 1. The active devices and metallization 9 and 19 are further illustrated with respective active devices 8 and 18 at the respective IC dice 10 and 20.

Figure 2:
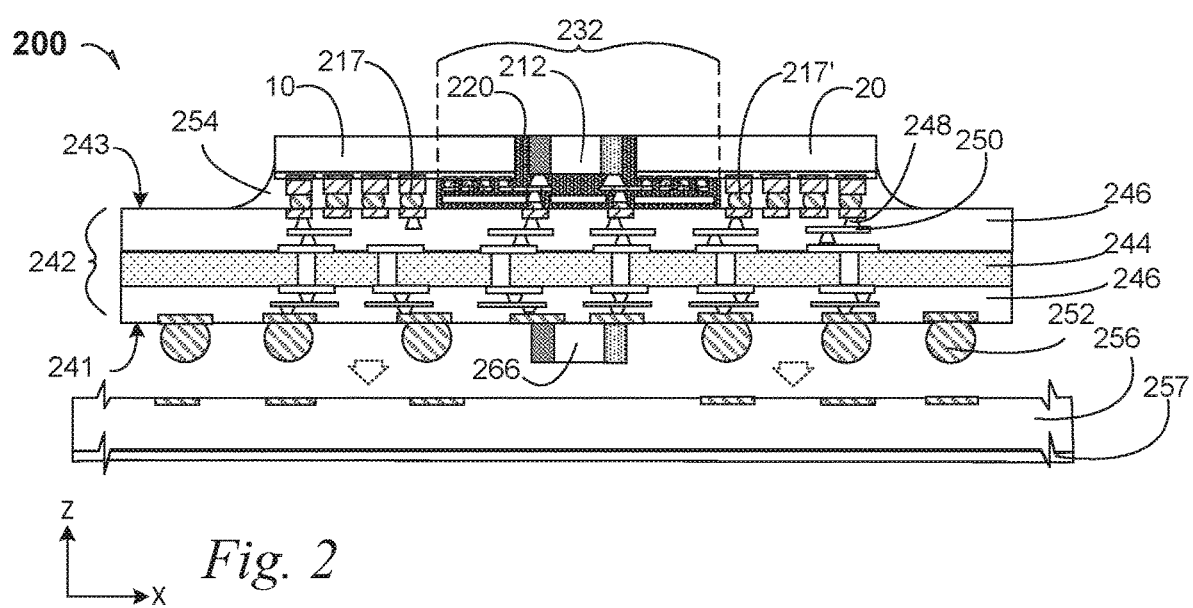
FIG. 2 is a cross-section elevation of an integrated-circuit package apparatus with a composite-bridge die-to-die interconnect according to an embodiment.

FIG. 2 is a cross-section elevation of an integrated-circuit package apparatus 200 with a composite-bridge die-to-die interconnect 232 according to an embodiment. The IC package 200 includes a first and a subsequent IC die 10 and 20, respectively, the composite-bridge die-to-die interconnect 232 and a passive device 212 that is located in a molding layer 220 between the IC dice 10 and 20, while the IC dice 10 and 20 and the composite-bridge die-to-die interconnect 232, are seated on a die side 243 of an IC package substrate 242. An underfill mass 254 has been flowed onto the die side 243 under the IC dice 10 and 20 and also to contact the composite-bridge die-to-die interconnect 232.

In an embodiment, a land-side passive device 266 is mounted "opossum" style on a land side 241 of the IC package substrate 242. The land-side passive device 266 is coupled by vertical-package interconnects (VPIs), substantially vertically from the land side 241, to the die side 243 and into the composite-bridge die-to-die interconnect 232. In concert with the capacitor 212, the land-side capacitor 266 provides enhanced power-supply noise suppression according to an embodiment. In an embodiment, the passive device 212 is a resistor.

Electrical bumps 217 and 217' assist to couple the IC dice 10 and 20 to the IC package substrate 242. The electrical bumps 217 and 217' create standoff, after reflow upon the die side 243 for usefully seating the composite-bridge die-to-die interconnect 232 on the die side 243.

In an embodiment, the IC package substrate 242 includes a core layer 244 for rigidity. Above and below the core layer 244, build-up layers 246 include organic layers that accommodate interconnects such as package vias 248 and traces 250 to facilitate interconnection of integrated-circuit (IC) dice 10 and 20 with composite-bridge die-to-die interconnect 232, as well as pin-out connections on the land side 241 of the IC package substrate 242, to an electrical bump array 252. In an embodiment, the organic layers 246 are fabricated from composites of epoxy polymer resins and silica particulate materials. In an embodiment width of the traces 250 is in a range from 5 μm to 40 μm. In an embodiment, the IC package substrate 242 may exclude the core layer 244 for package z-height (or thickness) reduction.

As illustrated in an embodiment, the IC package substrate 242 that carries the IC dice 10 and 20 and the composite-bridge die-to-die interconnect 232, is being brought toward a board 256 such as a motherboard 256 or a printed wiring board 256, and the land-side passive device 266 has a through-path from the land side 241 to the die side 243 and into the composite-bridge die-to-die interconnect 232.

In an embodiment, the board 256 has an external shell 257 that provides at least one of physical and electrical insulative protection for components on the board 256.

Figure 3:
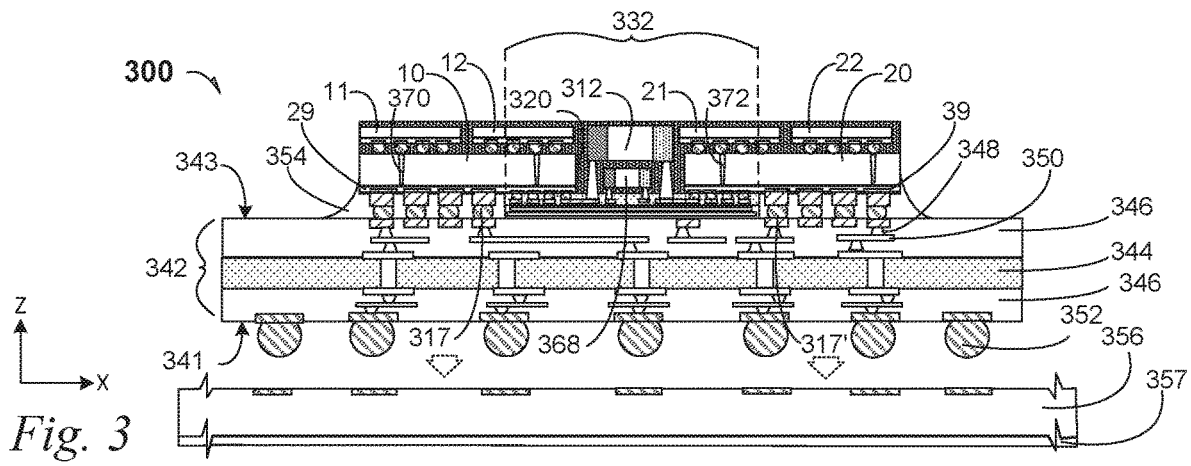
FIG. 3 is a cross-section elevation of an integrated-circuit package with a composite-bridge die-to-die interconnect according to an embodiment.

FIG. 3 is a cross-section elevation of an integrated-circuit package 300 with a composite-bridge die-to-die interconnect 332 according to an embodiment. The IC package 300 includes a first and a subsequent IC die 10 and 20, respectively, the composite-bridge die-to-die interconnect 332 and an upper passive device 312 that is located in the molding layer 320 between the IC dice 10 and 20, while the IC dice 10 and 20 and the composite-bridge die-to-die interconnect 332, are seated on a die side 343 of an IC package substrate 342. An underfill mass 354 has been flowed onto the die side 343 under the IC dice 10 and 20 and also to contact the composite-bridge die-to-die interconnect 332.

In an embodiment, an inner passive device 368 is mounted in a fashion such that the first, upper passive device 312 is "astride" the inner passive device 368, while each of the passive devices 312 and 368 are contacting the composite-bridge die-to-die interconnect 332. In any event, with the molding material 320, the stacked passive components 312 and 368 are isolated from each other.

In an embodiment, the first IC die 10 has a through-silicon via (TSV) 370 that communicates to an active layer and metallization 29, first backside-die chiplet 11, such as a memory die. Similarly, a first IC die, subsequent backside-die chiplet 12 is also on the first IC die 10, and is coupled through a TSV. In an embodiment, the subsequent IC die 20 has a through-silicon via (TSV) 372 that communicates to an active layer and metallization 39, first backside-die chiplet 21, such as a memory die. Similarly, a subsequent IC die, subsequent backside-die chiplet 22 is also on the subsequent IC die 20, and is coupled through a TSV.

First and subsequent electrical bumps 317 and 317' assist to couple the respective first and subsequent IC dice 10 and 20 to the IC package substrate 342. The electrical bumps 317 and 317' create a standoff, after reflow upon the die side 343 for usefully seating the composite-bridge die-to-die interconnect 332 on the die side 343.

In an embodiment, the IC package substrate 342 includes a core layer 344 for rigidity. Above and below the core layer 344, build-up layers 346 include organic layers that accommodate interconnects such as package vias 348 and traces 350 to facilitate interconnection of integrated-circuit (IC) dice 10 and 20 with composite-bridge die-to-die interconnect 332, as well as pin-out connections on the land side 341 of the IC package substrate 342, to an electrical bump array 352. In an embodiment, the organic layers 346 are fabricated from composites of epoxy polymer resins and silica particulate materials. In an embodiment, width of the traces 350 is in a range from 5 μm to 40 μm. In an embodiment, the IC package substrate 342 may exclude the core layer 344 for package z-height (or thickness) reduction.

As illustrated in an embodiment, the IC package substrate 342 that carries the IC dice 10 and 20 and the composite-bridge die-to-die interconnect 332, is being brought toward a board 356 such as a motherboard 356 or a printed wiring board 356.

In an embodiment, the board 356 has an external shell 357 that provides at least one of physical and electrical insulative protection for components on the board 356.

Figure 3A:
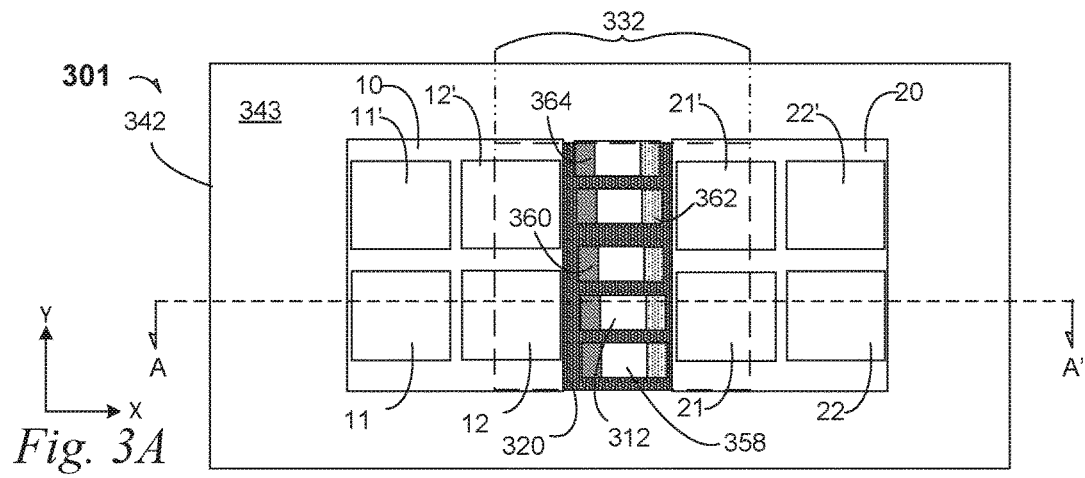
FIG. 3A is a top plan of the composite-bridge die-to-die interconnect-containing integrated-circuit package apparatus depicted in FIG. 3 according to several embodiments.

FIG. 3A is a top plan 301 of the composite-bridge die-to-die interconnect-containing integrated-circuit package apparatus 300 depicted in FIG. 3 according to several embodiments. The cross-section elevation depicted in FIG. 3 may be taken from the section line A-A' in FIG. 3A. The board 356 is not represented. The die side 343 supports the first and subsequent IC dice 10 and 20, and the composite-bridge die-to-die interconnect 332 with the several passive devices in the molding layer 320 between the IC dice 10 and 20.

In the plan view, the first IC die 10 carries several chiplets 11, 11', 12 and 12', and the subsequent IC die 20 carries several chiplets 21, 21', 22 and 22'.

In the plan view, the inner passive device 368 (see FIG. 3) is obscured by the first, upper passive device 312. In an embodiment, the passive device 312 is a first capacitor 312 and a subsequent passive device 358 is a subsequent capacitor 358 that couples into the composite-bridge die-to-die interconnect 332. In an embodiment, a subsequent inner passive device is deployed below the subsequent passive device 358. Further passive devices, where the passive device 312 is a first passive device in the molding material 320, include the subsequent passive device 358, a third passive device 360, a fourth 362 and a fifth passive device 364 according to several embodiments. In an embodiment, at least two of the upper passive devices are astride an inner passive device, such as the first passive device 312 and the subsequent passive device 358 are each astride the first inner passive device 368 as depicted in FIG. 3. In an embodiment, more than two inner passive devices are below the several upper passive devices as illustrated. In an embodiment, more than three inner passive devices are below the several upper passive devices as illustrated. In an embodiment, more than four inner passive devices are below the several upper passive devices as illustrated.

The several upper passive and inner passive device embodiments are in the molding material 320 and are an integral portion of the composite-bridge die-to-die interconnect 332, such that the several upper passive and inner passive devices, support the IC dice 10 and 20, without the need to be embedded in the IC package substrate 342.

In an embodiment, the several passive devices are decoupling capacitors 312, 358, 360, 362 and 364 and the several inner passive-device embodiments are also decoupling capacitors. In an embodiment, subsets of the capacitors are separately coupled to different potential power rails, such as a 1.0 Volt power rail for the first and subsequent capacitors 312, and 358 and a 1.5 V power rail for the capacitors 360, 362 and 364. In an embodiment, the several inner passive devices have the same power-rail connection and use for a 1.0 V power rail. In an embodiment, a subset of the several inner passive devices have the same power-rail connection and use for a 1.0 V power rail, and a subset of the several inner passive devices have a power-rail connection for either a higher than 1.0 V usage or a lower than 1.0 V usage. In an embodiment, the capacitors have a thickness in a range from 20 μm to 500 μm, and the inner capacitors have a width or a length less than that of the capacitors that are astride the inner capacitors.

In an embodiment, a first integrated-circuit die 10 is a central processing unit such as a processor made by Intel Corporation of Santa Clara, Calif. In an embodiment, the subsequent IC die 20 is a graphics processor 20. In an embodiment, the first IC die 10 is a processor die that supports more than one TSV-connected memory die such as dice 11 and 11'. In an embodiment, the subsequent IC die 20 is a graphics-processor die that supports more than one TSV-connected memory die such as dice 21 and 21'.

In an embodiment, the first IC die 10 is bumped onto the die side 343 with a bump array 317 and 317' (see FIG. 3) with a bump-pitch geometry in a range from 70 micrometer (μm) to 150 μm.

Figure 3B:
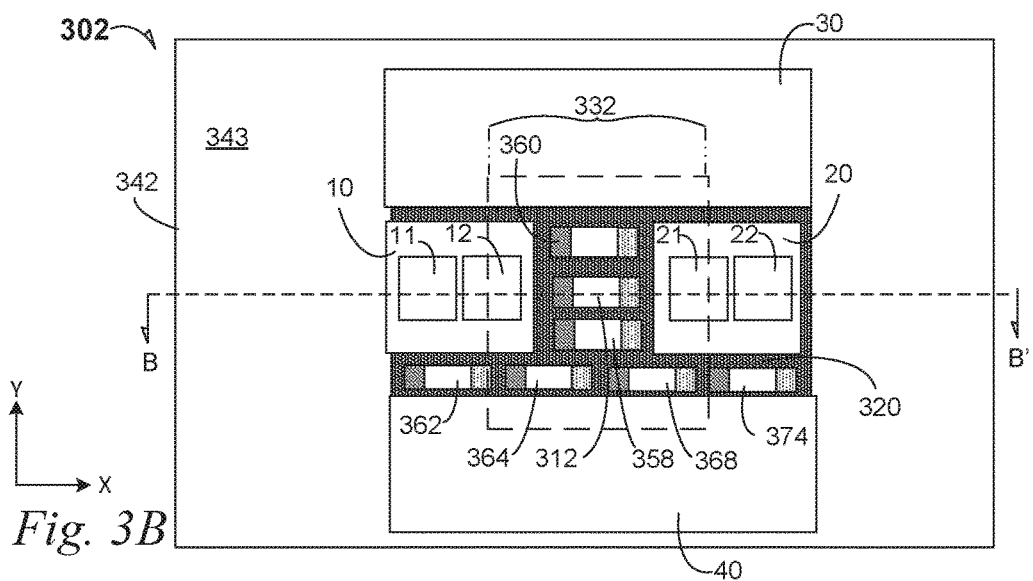
FIG. 3B is a top plan of a composite-bridge die-to-die interconnect-containing integrated-circuit package apparatus, such as the composite-bridge die-to-die interconnect-containing integrated-circuit package apparatus depicted in FIG. 3 according to several embodiments.
Figure 4:
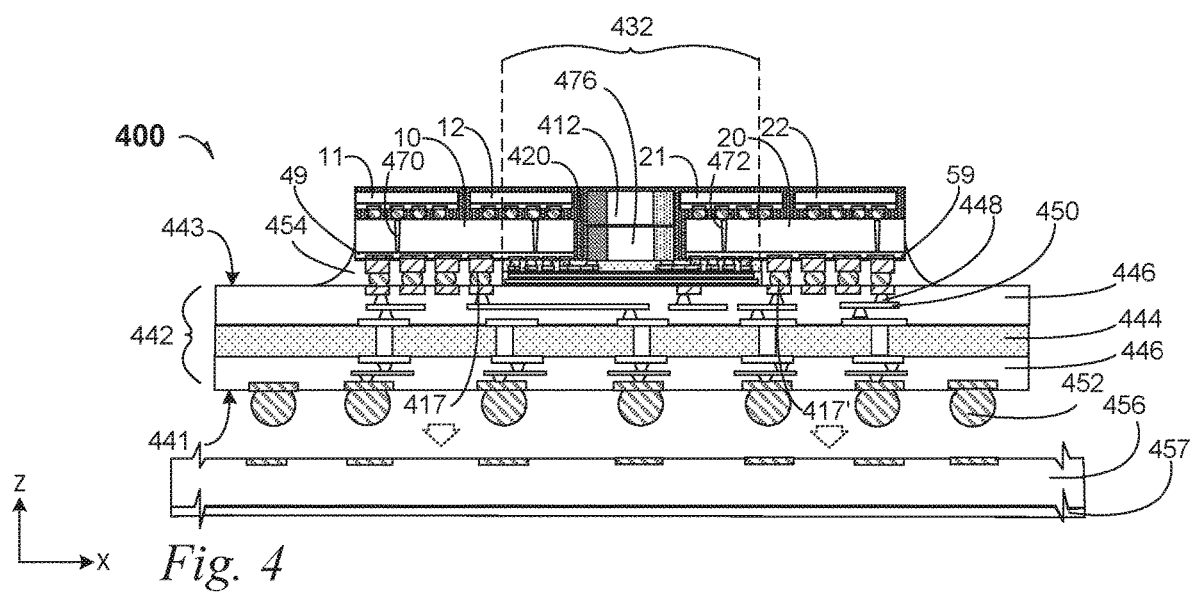
FIG. 4 is a cross-section elevation of an integrated-circuit package apparatus with a composite-bridge die-to-die interconnect according to an embodiment.

FIG. 3B is a top plan 302 of a composite-bridge die-to-die interconnect-containing integrated-circuit package apparatus, such as the composite-bridge die-to-die interconnect-containing integrated-circuit package apparatus 300 depicted in FIG. 3 according to several embodiments. The cross-section elevation depicted in FIG. 3 may be taken from the section line B-B' in FIG. 3B. The board 356 is not represented. In an embodiment, the first passive device 312 straddles a first inner passive device 368 (see FIG. 3). In an embodiment, the first passive device 312 is seated atop a first lower passive device 476 such as is illustrated in FIG. 4.

The die side 343 supports the first and subsequent IC dice 10 and 20, and the composite-bridge die-to-die interconnect 332 with the several passive devices in the molding layer 320 between the IC dice 10 and 20. Additionally, a third IC die 30 and a fourth IC die 40 are also on the die side 343 of the IC package substrate 342.

In the plan view, the first IC die 10 carries several chiplets 11 and 12, and the subsequent IC die 20 carries several chiplets 21 and 22.

In the plan view, the first, subsequent and third passive devices 312, 358 and 360 are in the molding material 320, and contacting the composite-bridge die-to-die interconnect 332. In an embodiment, a fourth passive device 362 is in the molding material 320, between the first IC die 10 and the fourth IC die 40. In an embodiment, a fifth passive device 364 is in the molding material 320, between the first IC die 10 and the fourth IC die 40, and also adjacent the subsequent passive device 358. In an embodiment, a sixth passive device 368 is in the molding material 320, between the subsequent IC die 20 and the fourth IC die 40, and also adjacent the subsequent passive device 358. In an embodiment, a seventh passive device 374 is in the molding material 320, between the subsequent IC die 20 and the fourth IC die 40, and also adjacent the sixth passive device 368.

The several passive device embodiments are in the molding material 320 and are an integral portion of the composite-bridge die-to-die interconnect 332, such that the several passive devices, support the IC dice 10, 20, 30 and 40, without the need to be embedded in the IC package substrate 342.

In an embodiment, the several passive devices are decoupling capacitors 312, 358, 360, 362, 364, 368 and 374. In an embodiment, subsets of the capacitors are separately coupled to different potential power rails, such as a 1.0 Volt power rail for the capacitor 312, and 358 and a 1.5 V power rail for the capacitors 360, 362 and 364. In an embodiment, the several passive devices have the same power-rail connection and use for a 1.0 V power rail. In an embodiment, a subset of the several passive devices 368 and 374 have the same power-rail connection and use for a 1.0 V power rail, and a subset of the several passive devices 368 and 374 have a power-rail connection for either a higher than 1.0 V usage or a lower than 1.0 V usage. In an embodiment, the capacitors have a thickness in a range from 20 μm to 500 μm.

In an embodiment, a first integrated-circuit die 10 is a central processing unit such as a processor made by Intel Corporation of Santa Clara, Calif. In an embodiment, the subsequent IC die 20 is a graphics processor 20. In an embodiment, the third IC die 30 is a platform controller hub 30. In an embodiment, the fourth IC die 40 is a baseband processor 40. In an embodiment, the several dice 10, 20, 30 and 40 include functions of a CPU, GPU, memory, a field-programmable gate array (FPGA), and baseband processor.

In an embodiment, the first IC die 10 is a processor die that supports more than one TSV-connected memory die such as dice 11 and 12. In an embodiment, the subsequent IC die 20 is a graphics-processor die that supports more than one TSV-connected memory die such as dice 21 and 22.

In an embodiment, the first IC die 10 is bumped onto the die side 343 with a bump array 317 and 317' (see FIG. 3) with a bump-pitch geometry in a range from 70 micrometer (μm) to 150 μm.

In an embodiment as illustrated, the composite-bridge die-to-die interconnect 332 is a die-to-die bridge 332 where permutations of the several dice are directly connected such as with die-to-die trace 134 depicted in FIG. 1G. For example, the composite-bridge die-to-die interconnect 332 has die-to-die traces between any adjacent IC dice, in non-equivalent embodiments: IC dice 10 and 20, IC dice 10 and 30, IC dice 10 and 40, IC dice 20 and 40, and IC dice 20 and 30. Further and similar to the die-to-die trace 134 that couples the IC dice 10 and 20 in FIG. 1G, a die-to-die trace in the composite-bridge die-to-die interconnect 332, couples the third and fourth IC dice 30 and 40.

FIG. 4 is a cross-section elevation of an integrated-circuit package apparatus 400 with a composite-bridge die-to-die interconnect 432 according to an embodiment. The IC package 400 includes a first and a subsequent IC die 10 and 20, respectively, the composite-bridge die-to-die interconnect 432 and an upper passive device 412 that is located in a molding layer 420 between the IC dice 10 and 20, while the IC dice 10 and 20 and the composite-bridge die-to-die interconnect 432, are seated on a die side 443 of an IC package substrate 442. An underfill mass 454 has been flowed onto the die side 443 under the IC dice 10 and 20 and also to contact the composite-bridge die-to-die interconnect 432.

In an embodiment, a lower passive device 476 is mounted in a fashion such that a first, upper passive device 412 is above and on (in e.g. direct-soldered contact) the lower passive device 476, while the lower passive device 476 is contacting the composite-bridge die-to-die interconnect 432.

In an embodiment, the first IC die 10 has a through-silicon via (TSV) 470 that communicates to an active layer and metallization 49, first backside-die chiplet 11, such as a memory die. Similarly, a first IC die, subsequent backside-die chiplet 12 is also on the first IC die 10, and is coupled through a TSV. In an embodiment, the subsequent IC die 20 has a through-silicon via (TSV) 472 that communicates to an active layer and metallization 49, first backside-die chiplet 21, such as a memory die. Similarly, a subsequent IC die, subsequent backside-die chiplet 22 is also on the subsequent IC die 20, and is coupled through a TSV.

Electrical bumps 417 and 417' assist to couple the IC dice 10 and 20 to the IC package substrate 442. The electrical bumps 417 and 417' create standoff, after reflow upon the die side 443 for usefully seating the composite-bridge die-to-die interconnect 432 on the die side 443.

In an embodiment, the IC package substrate 442 includes a core layer 444 for rigidity. Above and below the core layer 444, build-up layers 446 include organic layers that accommodate interconnects such as package vias 448 and traces 450 to facilitate interconnection of integrated-circuit (IC) dice 10 and 20 with composite-bridge die-to-die interconnect 432, as well as pin-out connections on the land side 441 of the IC package substrate 442, to an electrical bump array 452. In an embodiment, the organic layers 446 are fabricated from composites of epoxy polymer resins and silica particulate materials. In an embodiment width of the traces 550 is in a range from 5 µm to 40 µm. In an embodiment, the IC package substrate 442 may exclude the core layer 444 for package z-height (or thickness) reduction.

As illustrated in an embodiment, the IC package substrate 442 that carries the IC dice 10 and 20 and the composite-bridge die-to-die interconnect 432, is being brought toward a board 456 such as a motherboard 456 or a printed wiring board 456.

In an embodiment, the board 456 has an external shell 457 that provides at least one of physical and electrical insulative protection for components on the board 456.

It may now be understood that the integrated-circuit package 400 with the composite-bridge die-to-die interconnect 432 as depicted in FIG. 4, may also be viewed according FIG. 3A, with the upper and lower passive devices, e.g. 412 and 476 in FIG. 4, replacing the first upper and inner passive devices 312 and 368, respectively in FIGS. 3 and 3A. Accordingly, the several different voltage ratings set forth for the several capacitors in FIGS. 3 and 3A may be mapped to equivalent capacitors in FIG. 4, with the limitation as the capacitors 412 and 476 are in direct contact, they are rated in series.

It may now be understood that the integrated-circuit package 400 with the composite-bridge die-to-die interconnect 432 as depicted in FIG. 4, may also be viewed according FIG. 3B, with the upper and lower passive devices, e.g. 412 and 476 in FIG. 4, replacing the several capacitors 312, 358 and 360 with stacked upper and lower capacitors in FIG. 3B. Accordingly, the several different voltage ratings set forth for the several capacitors in FIG. 3B may be mapped to equivalent capacitors in FIG. 4, with the limitation as the capacitors 412 and 476 are in direct contact, they are rated in series.

Figure 5:
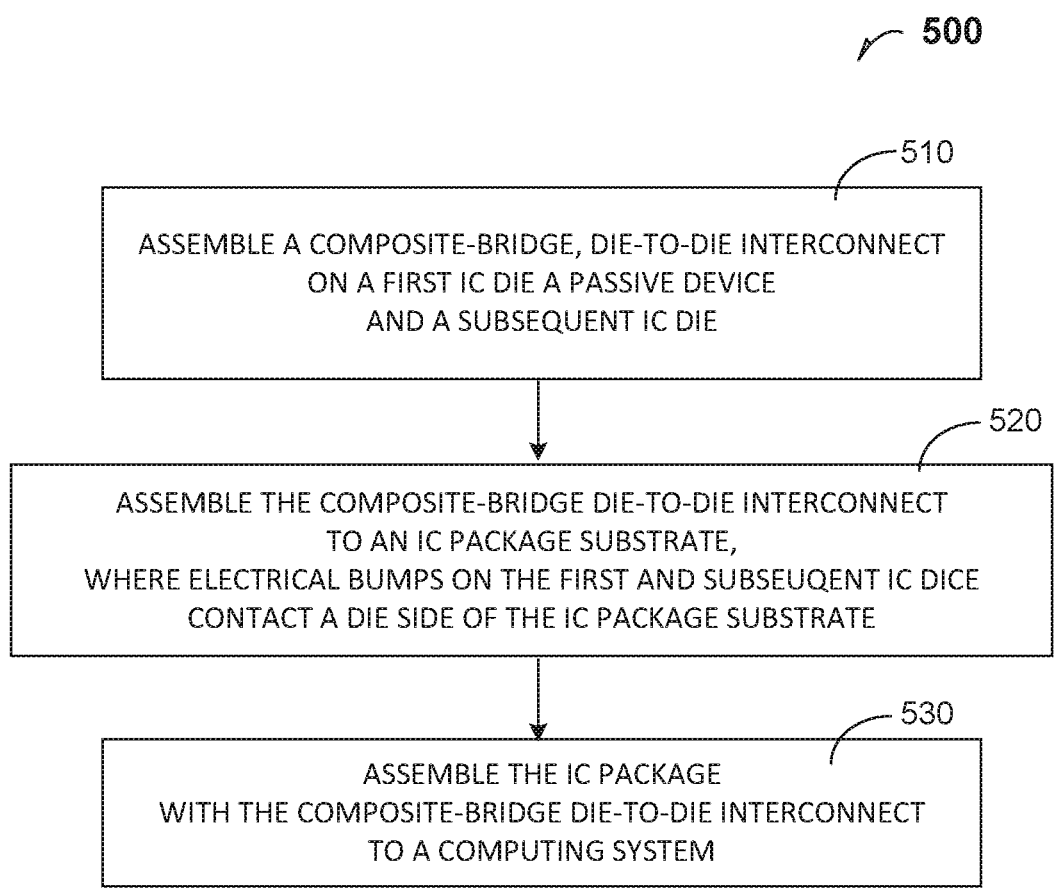
FIG. 5 is a process flow diagram for assembling a composite-bridge die-to-die interconnect to an integrated-circuit package apparatus according to several embodiments.

FIG. 5 is a process flow diagram for assembling a composite-bridge die-to-die interconnect to an integrated-circuit package apparatus according to several embodiments.

At 510, the process includes assembling a composite-bridge die-to-die interconnect onto a first IC die and a subsequent IC die, and to a passive device between the first and subsequent IC dice. In a non-limiting example embodiment, the first and subsequent IC dice 10 and 20, and the composite-bridge die-to-die interconnect 132 in FIG. 1G, have been assembled with the passive device 112 by use of the molding layer 120.

At 520, the process includes assembling the composite-bridge die-to-die interconnect to an integrated-circuit package substrate. In a non-limiting example embodiment, the integrated-circuit device apparatus including the IC dice 10 and 20, the composite-bridge die-to-die interconnect 132 and the passive device 112, are seated onto bumps 117 and 117' on a die side 143 of the IC package substrate 142, as illustrated in FIG. 1H. It may now be understood any of the IC device packages depicted in FIGS. 1, 2, 3, 3A, 3B and 4 with their disclosed permutations, may be assembled to an IC package substrate at the die side.

At 530, the process includes assembling the IC package with the composite-bridge die-to-die interconnect, to a computing system. In a non-limiting example embodiment, the computing system 600 depicted in FIG. 6 is used.

Figure 6:
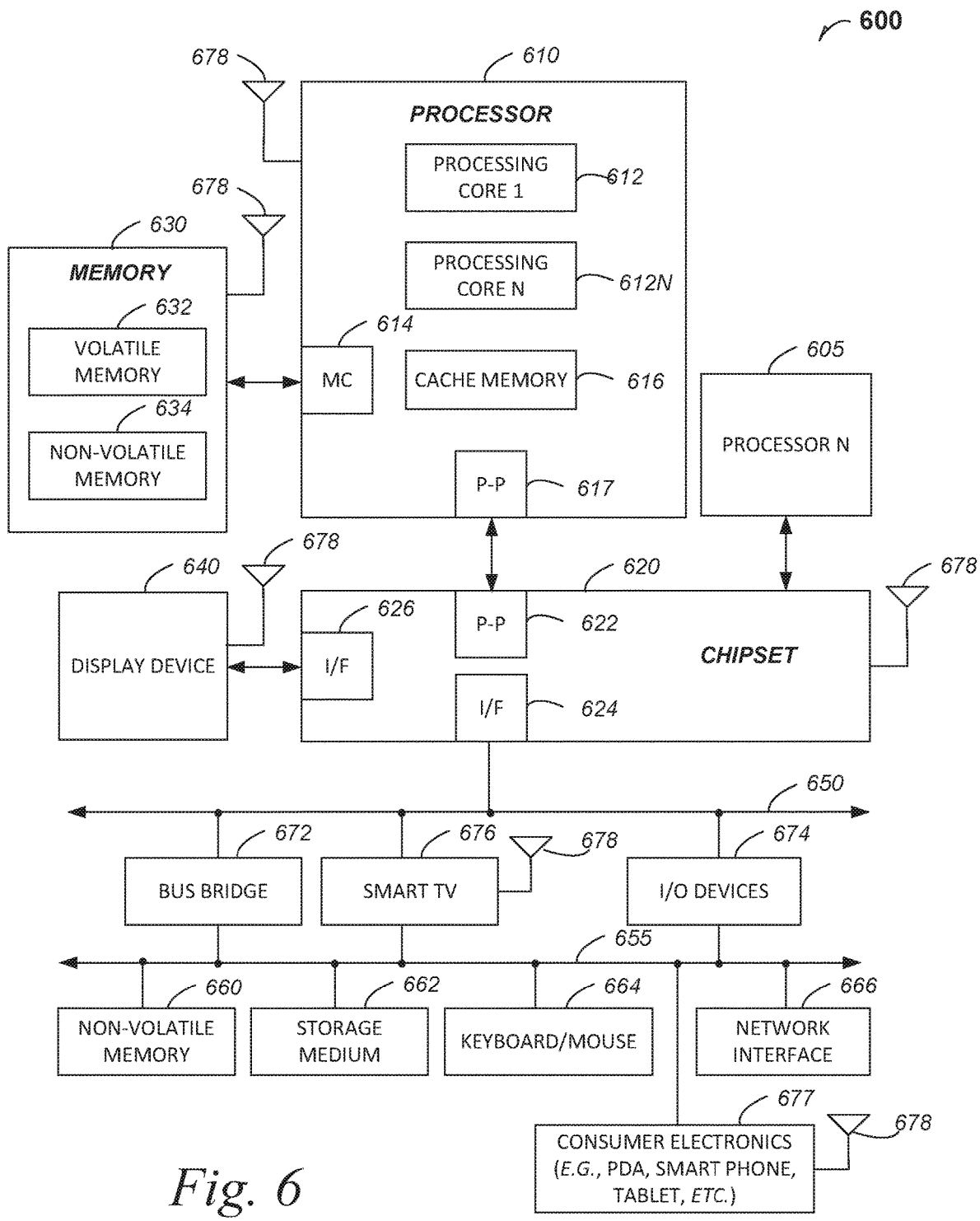
FIG. 6 is included to show an example of a higher-level device application for the disclosed embodiments.

FIG. 6 is included to show an example of a higher-level device application for the disclosed embodiments. The composite-bridge die-to-die interconnect embodiments may be found in several parts of a computing system. In an embodiment, the composite-bridge die-to-die interconnect embodiments can be part of a communications apparatus such as is affixed to a cellular communications tower. In an embodiment, a computing system 600 includes, but is not limited to, a desktop computer. In an embodiment, a computing system 600 includes, but is not limited to a laptop computer. In an embodiment, a computing system 600 includes, but is not limited to a tablet. In an embodiment, a computing system 600 includes, but is not limited to a notebook computer. In an embodiment, a computing system 600 includes, but is not limited to a personal digital assistant (PDA). In an embodiment, a computing system 600 includes, but is not limited to a server. In an embodiment, a computing system 600 includes, but is not limited to a workstation. In an embodiment, a computing system 600 includes, but is not limited to a cellular telephone. In an embodiment, a computing system 600 includes, but is not limited to a mobile computing device. In an embodiment, a computing system 600 includes, but is not limited to a smart phone. In an embodiment, a system 600 includes, but is not limited to an internet appliance. Other types of computing devices may be configured with the microelectronic device that includes composite-bridge die-to-die interconnect embodiments.

In an embodiment, the processor 610 has one or more processing cores 612 and 612N, where 612N represents the Nth processor core inside processor 610 where N is a positive integer. In an embodiment, the electronic device system 600 using a composite-bridge die-to-die interconnect embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the composite-bridge die-to-die interconnect element on an integrated-circuit package substrate in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. In an embodiment, the chipset 620 is part of a composite-bridge die-to-die interconnect embodiment depicted, e.g. in FIGS. 1, 2, 3, 3A, 3B and 4.

The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a composite-bridge die-to-die interconnect embodiment as set forth in this disclosure. The chipset 620 enables the processor 610 to connect to other elements in a composite-bridge die-to-die interconnect embodiment in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In an embodiment, the processor 610 and the chipset 620 are merged into a composite-bridge die-to-die interconnect embodiment in a system. Additionally, the chipset 620 connects to one or more buses 650 and 655 that interconnect various elements 674, 660, 662, 664, and 666. Buses 650 and 655 may be interconnected together via a bus bridge 672 such as at least one composite-bridge die-to-die interconnect embodiment. In an embodiment, the chipset 620, via interface 624, couples with a non-volatile memory 660, a mass storage device(s) 662, a keyboard/mouse 664, a network interface 666, smart TV 676, and the consumer electronics 677, etc.

In an embodiment, the mass storage device 662 includes, but is not limited to, a solid-state drive, a hard disk drive, a universal serial bus flash memory drive, or any other form of computer data storage medium. In one embodiment, the network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the composite-bridge die-to-die interconnect embodiments in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

To illustrate the composite-bridge die-to-die interconnect IC package embodiments and methods disclosed herein, a non-limiting list of examples is provided herein:

Example 1 is an integrated-circuit apparatus, comprising: a first integrated-circuit (IC) die; a subsequent IC die; a composite-bridge die-to-die interconnect contacting composite-bridge bond pads on each of the first and subsequent IC dice, and wherein the composite-bridge die-to-die interconnect exposes package-connect bond pads on each of the first and subsequent IC dice; a passive device between the first and subsequent IC dice, and contacting the composite-bridge die-to-die interconnect; and a molding material that contacts the first and subsequent IC dice, the passive device and the composite-bridge die-to-die interconnect.

In Example 2, the subject matter of Example 1 optionally includes a first lateral interconnect in the composite-bridge die-to-die interconnect, that couples to the first IC die and to the passive device; and a subsequent lateral interconnect in the composite-bridge die-to-die interconnect, that couples to the subsequent IC die and to the passive device.

In Example 3, the subject matter of any one or more of Examples 1-2 optionally include a die-to-die trace in the composite-bridge die-to-die interconnect, that bypasses the passive device and couples the first and subsequent IC dice.

In Example 4, the subject matter of any one or more of Examples 1-3 optionally include a conductive shield in the composite-bridge die-to-die interconnect, wherein the conductive shield projects a footprint onto the composite-bridge bond pads, and onto the passive device.

In Example 5, the subject matter of any one or more of Examples 1-4 optionally include a first lateral interconnect in the composite-bridge die-to-die interconnect, that couples to the first IC die and to the passive device; a subsequent lateral interconnect in the composite-bridge die-to-die interconnect, that couples to the subsequent IC die and to the passive device; and a die-to-die trace in the composite-bridge die-to-die interconnect, that bypasses the passive device and couples the first and subsequent IC dice.

In Example 6, the subject matter of any one or more of Examples 1-5 optionally include a first lateral interconnect in the composite-bridge die-to-die interconnect, that couples to the first IC die and to the passive device; a subsequent lateral interconnect in the composite-bridge die-to-die interconnect, that couples to the subsequent IC die and to the passive device; and a conductive shield in the composite-bridge die-to-die interconnect, wherein the conductive shield projects a footprint onto the composite-bridge bond pads, and onto the passive device.

In Example 7, the subject matter of any one or more of Examples 1-6 optionally include a first lateral interconnect in the composite-bridge die-to-die interconnect, that couples to the first IC die and to the passive device; a subsequent lateral interconnect in the composite-bridge die-to-die interconnect, that couples to the subsequent IC die and to the passive device; a die-to-die trace in the composite-bridge die-to-die interconnect, that bypasses the passive device and couples the first and subsequent IC dice; and a conductive shield in the composite-bridge die-to-die interconnect, wherein the conductive shield projects a footprint onto the composite-bridge bond pads, and onto the passive device.

In Example 8, the subject matter of any one or more of Examples 1-7 optionally include an integrated-circuit package substrate; and package-connect electrical bumps contacting the package-connect bond pads, wherein the electrical bumps are on the integrated-circuit package substrate at a die side.

In Example 9, the subject matter of any one or more of Examples 1-8 optionally include an integrated-circuit package substrate; package-connect electrical bumps contacting the package-connect bond pads, wherein the electrical bumps are on the integrated-circuit package substrate at a die side; and wherein the composite-bridge die-to-die interconnect is also on the die side.

In Example 10, the subject matter of any one or more of Examples 1-9 optionally include wherein the passive device is an embedded passive device, further including: an integrated-circuit package substrate including a die side and a land side; package-connect electrical bumps contacting the package-connect bond pads, wherein the electrical bumps are on the integrated-circuit package substrate at the die side; and a bottom passive device on the land side, wherein the bottom passive device is coupled to at least one of the first and subsequent IC dice.

Example 11 is an integrated-circuit package apparatus, comprising: an integrated-circuit package substrate including a die side and a land side; a first integrated-circuit (IC) die on the die side; a subsequent IC die on the die side; a composite-bridge die-to-die interconnect contacting composite-bridge bond pads on each of the first and subsequent IC dice, and wherein the composite-bridge die-to-die interconnect exposes package-connect bond pads on each of the first and subsequent IC dice; package-connect bond pads contacting the first and subsequent IC dice at the die side; a passive device between the first and subsequent IC dice, and coupled to the composite-bridge die-to-die interconnect; and a molding material that contacts the first and subsequent IC dice, the passive device and the composite-bridge die-to-die interconnect.

In Example 12, the subject matter of Example 11 optionally includes wherein the passive device contacts the composite-bridge die-to-die interconnect.

In Example 13, the subject matter of any one or more of Examples 11-12 optionally include at least one chiplet on the first IC die, and coupled to the first IC die by a through-silicon via.

In Example 14, the subject matter of any one or more of Examples 11-13 optionally include at least one chiplet on the first IC die, and coupled to the first IC die by a through-silicon via; and at least one chiplet on the subsequent IC die, and coupled to the subsequent IC die by a through-silicon via.

In Example 15, the subject matter of any one or more of Examples 11-14 optionally include wherein the passive device is a first passive device, further including a subsequent passive device between the first and subsequent IC dice and in the molding material, wherein the subsequent passive device contacts the composite-bridge die-to-die interconnect.

In Example 16, the subject matter of any one or more of Examples 11-15 optionally include wherein the passive device is a first passive device, further including a first inner passive device below the first passive device and in the molding material, wherein the first inner passive device contacts the composite-bridge die-to-die interconnect.

In Example 17, the subject matter of any one or more of Examples 11-16 optionally include wherein the passive device is a first passive device, further including: a first inner passive device below the first passive device and in the molding material, wherein the first inner passive device contacts the composite-bridge die-to-die interconnect; a subsequent passive device between the first and subsequent IC dice and in the molding material, wherein the subsequent passive device contacts the composite-bridge die-to-die interconnect; and a subsequent inner passive device below the subsequent passive device and in the molding material, wherein the subsequent inner passive device contacts the composite-bridge die-to-die interconnect.

In Example 18, the subject matter of any one or more of Examples 11-17 optionally include wherein the passive device is a first passive device, further including: a subsequent passive device between the first and subsequent IC dice and in the molding material, wherein the subsequent passive device contacts the composite-bridge die-to-die interconnect; a third IC die on the die side, adjacent each of the first and subsequent IC dice; a fourth IC die on the die side, adjacent each of the first and subsequent IC dice; and a third passive device between the first and fourth IC dice and in the molding material, wherein the third passive device contacts the composite-bridge die-to-die interconnect.

In Example 19, the subject matter of any one or more of Examples 11-18 optionally include wherein the passive device is a first upper passive device, further including a first lower passive device below and contacting the first upper passive device and in the molding material, wherein the first lower passive device contacts the composite-bridge die-to-die interconnect.

In Example 20, the subject matter of any one or more of Examples 11-19 optionally include a printed wiring board coupled to the land side; and a chipset coupled to the printed wiring board.

In Example 21, the subject matter of Example 20 optionally includes wherein the printed wiring board includes an external shell that is a dielectric material, and wherein the external shell is at least part of the exterior of an apparatus selected from a mobile computing system and a drone.

Example 22 is a method of assembling an integrated-circuit apparatus, comprising: assembling a composite-bridge die-to-die interconnect on a first integrated-circuit die, a passive device and a subsequent integrated-circuit die, wherein the passive device is between the first and subsequent integrated-circuit dice; and contacting a molding material to the composite-bridge die-to-die interconnect, the first and subsequent integrated-circuit dice, and to the passive device.

In Example 23, the subject matter of Example 22 optionally includes assembling the composite-bridge die-to-die interconnect to an integrated-circuit package substrate on a die side, wherein electrical bumps on the first and subsequent integrated-circuit dice contact the die side; and underfilling the first and subsequent integrated-circuit dice.

In Example 24, the subject matter of any one or more of Examples 22-23 optionally include assembling the composite-bridge die-to-die interconnect to an integrated-circuit package substrate on a die side, wherein electrical bumps on the first and subsequent integrated-circuit dice contact the die side; underfilling the first and subsequent integrated-circuit dice; and assembling the integrated-circuit package substrate at a land side to a printed wiring board.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated-circuit apparatus, comprising:
   a first integrated-circuit (IC) die;
   a subsequent IC die;
   a composite-bridge die-to-die interconnect contacting composite-bridge bond pads on each of the first and subsequent IC dice, and wherein the composite-bridge die-to-die interconnect exposes package-connect bond pads on each of the first and subsequent IC dice;
   a passive device located laterally between the first and subsequent IC dice, and contacting the composite-bridge die-to-die interconnect; and
   a molding material that contacts the first and subsequent IC dice, the passive device and the composite-bridge die-to-die interconnect.

2. The integrated-circuit apparatus of claim 1, further including:
   a first lateral interconnect in the composite-bridge die-to-die interconnect, that couples to the first IC die and to the passive device; and
   a subsequent lateral interconnect in the composite-bridge die-to-die interconnect, that couples to the subsequent IC die and to the passive device.

3. The integrated-circuit apparatus of claim 1, further including a die-to-die trace in the composite-bridge die-to-die interconnect, that bypasses the passive device and couples the first and subsequent IC dice.

4. The integrated-circuit apparatus of claim 1, further including a conductive shield in the composite-bridge die-to-die interconnect, wherein the conductive shield projects a footprint onto the composite-bridge bond pads, and onto the passive device.

5. The integrated-circuit apparatus of claim 1, further including:
   a first lateral interconnect in the composite-bridge die-to-die interconnect, that couples to the first IC die and to the passive device;
   a subsequent lateral interconnect in the composite-bridge die-to-die interconnect, that couples to the subsequent IC die and to the passive device; and
   a die-to-die trace in the composite-bridge die-to-die interconnect, that bypasses the passive device and couples the first and subsequent IC dice.

6. The integrated-circuit apparatus of claim 1, further including:
   a first lateral interconnect in the composite-bridge die-to-die interconnect, that couples to the first IC die and to the passive device;
   a subsequent lateral interconnect in the composite-bridge die-to-die interconnect, that couples to the subsequent IC die and to the passive device; and
   a conductive shield in the composite-bridge die-to-die interconnect, wherein the conductive shield projects a footprint onto the composite-bridge bond pads, and onto the passive device.

7. The integrated-circuit apparatus of claim 1, further including:
   a first lateral interconnect in the composite-bridge die-to-die interconnect, that couples to the first IC die and to the passive device;
   a subsequent lateral interconnect in the composite-bridge die-to-die interconnect, that couples to the subsequent IC die and to the passive device;
   a die-to-die trace in the composite-bridge die-to-die interconnect, that bypasses the passive device and couples the first and subsequent IC dice; and
   a conductive shield in the composite-bridge die-to-die interconnect, wherein the conductive shield projects a footprint onto the composite-bridge bond pads, and onto the passive device.

8. The integrated-circuit apparatus of claim 1, further including:
an integrated-circuit package substrate; and
package-connect electrical bumps contacting the package-connect bond pads, wherein the electrical bumps are on the integrated-circuit package substrate at a die side.

9. The integrated-circuit apparatus of claim 1, further including:
an integrated-circuit package substrate;
package-connect electrical bumps contacting the package-connect bond pads, wherein the electrical bumps are on the integrated-circuit package substrate at a die side; and
wherein the composite-bridge die-to-die interconnect is also on the die side.

10. The integrated-circuit apparatus of claim 1, wherein the passive device is an embedded passive device, further including:
an integrated-circuit package substrate including a die side and a land side;
package-connect electrical bumps contacting the package-connect bond pads, wherein the electrical bumps are on the integrated-circuit package substrate at the die side; and
a bottom passive device on the land side, wherein the bottom passive device is coupled to at least one of the first and subsequent IC dice.

11. An integrated-circuit package apparatus, comprising:
an integrated-circuit package substrate including a die side and a land side;
a first integrated-circuit (IC) die on the die side;
a subsequent IC die on the die side;
a composite-bridge die-to-die interconnect contacting composite-bridge bond pads on each of the first and subsequent IC dice, and wherein the composite-bridge die-to-die interconnect exposes package-connect bond pads on each of the first and subsequent IC dice;
package-connect bond pads contacting the first and subsequent IC dice at the die side;
a passive device located laterally between the first and subsequent IC dice, and coupled to the composite-bridge die-to-die interconnect; and
a molding material that contacts the first and subsequent IC dice, the passive device and the composite-bridge die-to-die interconnect.

12. The integrated-circuit package apparatus of claim 11, wherein the passive device contacts the composite-bridge die-to-die interconnect.

13. The integrated-circuit package apparatus of claim 11, further including at least one chiplet on the first IC die, and coupled to the first IC die by a through-silicon via.

14. The integrated-circuit package apparatus of claim 11, further including:
at least one chiplet on the first IC die, and coupled to the first IC die by a through-silicon via; and
at least one chiplet on the subsequent IC die, and coupled to the subsequent IC die by a through-silicon via.

15. The integrated-circuit package apparatus of claim 11, wherein the passive device is a first passive device, further including a subsequent passive device between the first and subsequent IC dice and in the molding material, wherein the subsequent passive device contacts the composite-bridge die-to-die interconnect.

16. The integrated-circuit package apparatus of claim 11, wherein the passive device is a first passive device, further including a first inner passive device below the first passive device and in the molding material, wherein the first inner passive device contacts the composite-bridge die-to-die interconnect.

17. The integrated-circuit package apparatus of claim 11, wherein the passive device is a first passive device, further including:
a first inner passive device below the first passive device and in the molding material, wherein the first inner passive device contacts the composite-bridge die-to-die interconnect;
a subsequent passive device between the first and subsequent IC dice and in the molding material, wherein the subsequent passive device contacts the composite-bridge die-to-die interconnect; and
a subsequent inner passive device below the subsequent passive device and in the molding material, wherein the subsequent inner passive device contacts the composite-bridge die-to-die interconnect.

18. The integrated-circuit package apparatus of claim 11, wherein the passive device is a first passive device, further including:
a subsequent passive device between the first and subsequent IC dice and in the molding material, wherein the subsequent passive device contacts the composite-bridge die-to-die interconnect;
a third IC die on the die side, adjacent each of the first and subsequent IC dice;
a fourth IC die on the die side, adjacent each of the first and subsequent IC dice; and
a third passive device between the first and fourth IC dice and in the molding material, wherein the third passive device contacts the composite-bridge die-to-die interconnect.

19. The integrated-circuit package apparatus of claim 11, wherein the passive device is a first upper passive device, further including a first lower passive device below and contacting the first upper passive device and in the molding material, wherein the first lower passive device contacts the composite-bridge die-to-die interconnect.

20. The integrated-circuit package apparatus of claim 11, further including:
a printed wiring board coupled to the land side; and
a chipset coupled to the printed wiring board.

21. The integrated-circuit package apparatus of claim 20, wherein the printed wiring board includes an external shell that is a dielectric material, and wherein the external shell is at least part of the exterior of an apparatus selected from a mobile computing system and a drone.

* * * * *